United States Patent [19]

Ryan et al.

[11] Patent Number: 4,866,389
[45] Date of Patent: Sep. 12, 1989

[54] CIRCUIT AND METHOD FOR MEASURING BATTERY VOLTAGE BY TIME OF DISCHARGE OF A CAPACITOR

[75] Inventors: John G. Ryan; Roubik Gregorian, both of San Jose, Calif.

[73] Assignee: Ventritex, Sunnyvale, Calif.

[21] Appl. No.: 208,285

[22] Filed: Jun. 17, 1988

[51] Int. Cl.$^4$ ............................................. G01N 27/46
[52] U.S. Cl. ................................... 324/433; 324/72; 340/636; 368/9
[58] Field of Search ............................... 324/426–428, 324/433, 60 CD, 111, 72; 320/48; 340/636; 368/9, 10, 121; 328/129.1; 128/419 PT; 73/5

[56] References Cited

U.S. PATENT DOCUMENTS

| | | | |
|---|---|---|---|
| 2,647,236 | 7/1953 | Saunderson et al. | 368/121 X |
| 4,058,808 | 11/1977 | Malaviya | 324/111 X |
| 4,071,822 | 1/1978 | Kamiya | 324/111 |

Primary Examiner—Reinhard J. Eisenzopf
Assistant Examiner—Jack B. Harvey
Attorney, Agent, or Firm—Limbach, Limbach & Sutton

[57] ABSTRACT

A voltage measurement circuit is provided which can be used in a single supply situation, which has a measurement range from rail to rail and which uses a reference voltage which can lie anywhere between the rails but not at the rail to which measurements are to be referenced. The unknown voltage is sampled to a first plate of a capacitor. The second plate of the capacitor is connected to ground. The first plate of the capacitor is then connected to the first input of a comparator, the second input being connected to receive the reference voltage. If the unknown voltage is less than the reference voltage, the second plate of the capacitor is disconnected from ground and then connected to receive the reference voltage. Otherwise it remains connected to ground. The first plate of the capacitor is then connected to a constant current source, causing the voltage at the first comparator input to decrease linearly with time. By measuring the elapsed time between the connection of the first capacitor plate to the constant current source and a change of state of the comparator due to the voltage decrease at its first input, the difference in voltage between the unknown voltage and the reference voltage or ground can be determined based on the linearity of the time-voltage relationship.

12 Claims, 2 Drawing Sheets

CIRCUIT AND METHOD FOR MEASURING BATTERY VOLTAGE BY TIME OF DISCHARGE OF A CAPACITOR

BACKGROUND OF THE INVENTION

The present invention relates to voltage measurement and, in particular, to circuitry and methods for obtaining accurate voltage measurements in battery powered electronic devices such as, for example, medical implantible devices.

The need to measure battery voltage accurately in medical implantible devices will be quickly acknowledged. It is critical that such devices provide for periodic and accurate measurement not only of battery voltage but also of a number of other voltages which may range from ground upwards. Examples of voltage levels which require periodic checking include residual capacitor voltage on completion of a pace pulse in pacemaker technology or of a high voltage pulse in defibrillator technology. Another common requirement is that small differences in voltage be measurable with an overall accuracy which is greater than the absolute accuracy of individual voltage measurements. Hence, monotonicity and repeatability are critical features of any measurement circuit utilized in these applications. A final implicit requirement is that very low power operation be possible, albeit at very slow measurement speeds.

The analog to digital conversion voltage measurement technique which is the subject of the present invention is a modified version of the well-known so-called "single slope" method. This type of A/D converter is inherently monotonic. Repeatability is limited primarily by comparator noise.

The "single-slope" technique operates as follows:

First, a known reference voltage $V_{ref}$ is sampled and held onto a capacitor. Next, a highly linear current source is connected across the capacitor and the timne taken for the capacitor to discharge to a known level $V_0$ (typically ground) is measured (T1). Then the unknown voltage Vx is sampled and held onto the same capacitor. The linear current source is then connected across the capacitor and, again, the time taken to discharge to $V_0$ is measured (T2). Finally, the unknown voltage Vx is calculated as follows:

$$V_X = T2/T1 \, (V_{ref} - V_0) + V_0 \quad (1)$$

In the case where $V_0 = 0$, then $$V_x = T2/T1 \, (v_{ref}).$$

In general, the use of ground as $V_0$ *requires the use of an auxiliary negative power supply. This option is obviously not available in battery powered devices. The alternative is to utilize a positive $V_0$.* This can be difficult since not only must this $V_0$ be fixed, but also, as can be deduced from Equation (1) above, it must be known to a high degree of precision. Hence, it effectively must be a second reference voltage. Use of this second known voltage level rules out measurement of voltages below that level.

SUMMARY OF THE INVENTION

According to the present invention, the conventional "single slope" technique for measuring voltage levels is modified to operate with a single reference voltage level and without the need for a negative power supply. The measurement range for this technique is from rail to rail, i.e. from ground up to and including battery voltage. Very low power operation is possible, since measurement accuracy is not degraded by reduction in comparator current if the current source is reduced proportionally. Calibration of the measurement circuit with respect to the known reference voltage $V_{ref}$ is achieved by a capacitive doubling of $V_{ref}$. Measurement of a unknown voltage $V_x$ which is less than the reference voltage $V_{ref}$ is achieved by capacitive addition of $V_x$ and $V_{ref}$.

A better understanding of the features and advantages of the present invention will be obtained by reference to the following detailed description and the accompanying drawings which set forth an illustrative embodiment in which the principles of the invention are utilized.

DETAILED DESCRIPTION OF THE INVENTION

Figure 1:
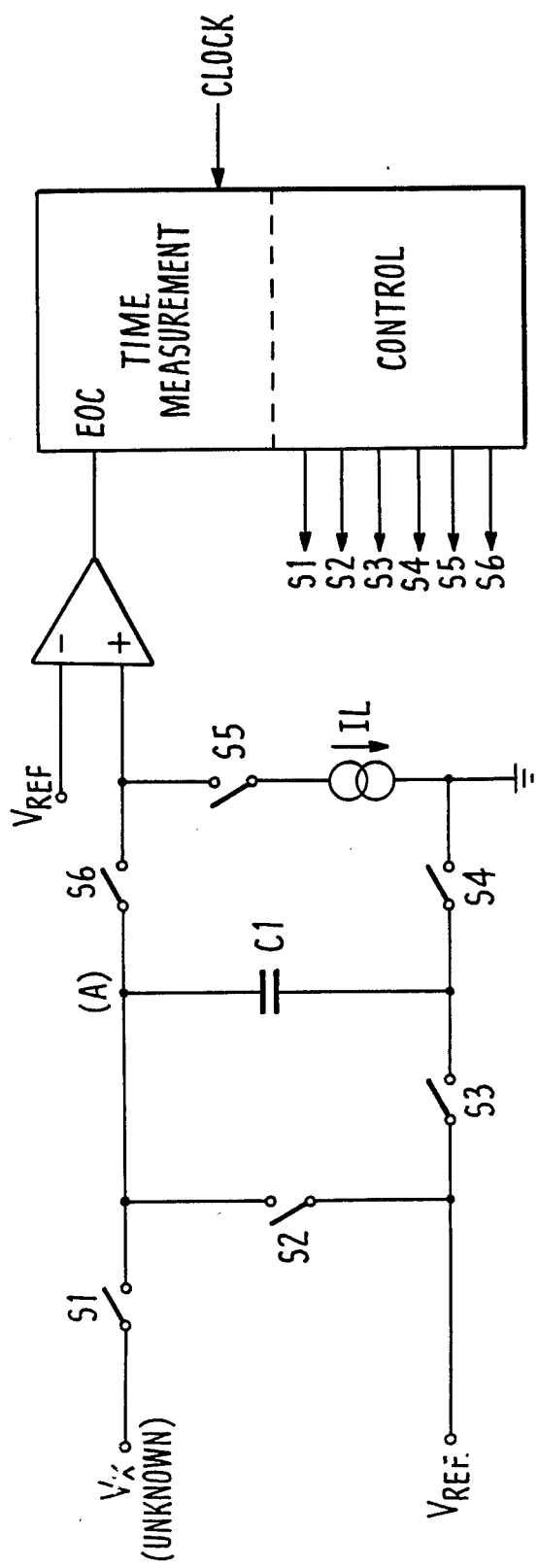
FIG. 1 is a schematic diagram illustrating an embodiment of a measurement circuit in accordance with the present invention.
Figure 2:
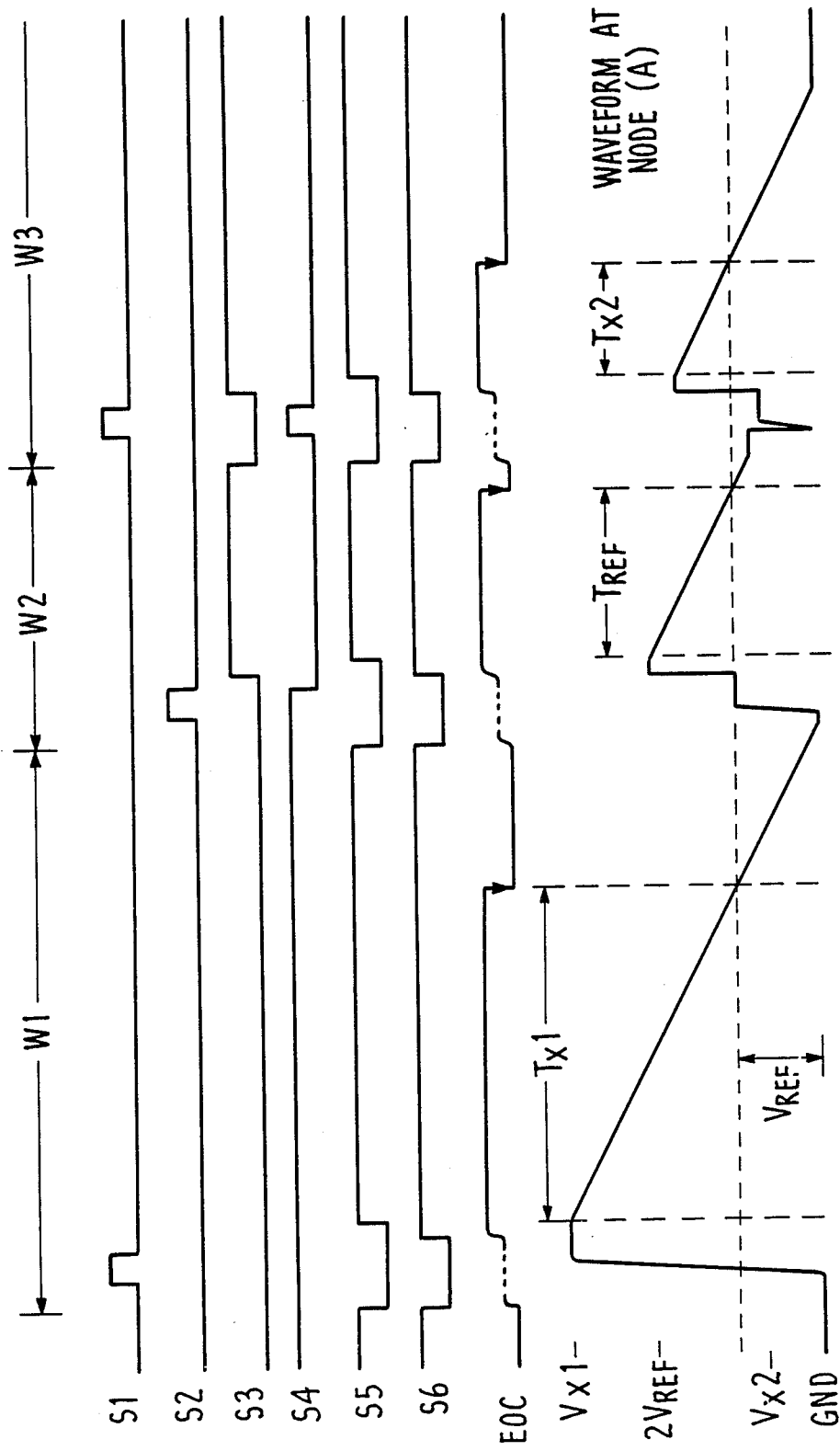
FIG. 2 is a timing diagram illustrating the time and voltage waveforms for operation of the circuit shown in FIG. 1.

A voltage measurement circuit in accordance with the present invention and its associated waveforms are shown in FIG. 1 and FIG. 2, respectively.

The waveform provided in FIG. 2 is divided into three sections W1, W2 and W3, which show the operation of the measurement circuit in three modes:

Mode 1: W1; measures an unknown voltage Vx1 which is greater than a reference voltage $V_{ref}$.

Mode 2: W2; calibrates the measurement circuit with the reference voltage $V_{ref}$.

Mode 3: W3; measure an unknown voltage Vx2 which is less than the reference voltage $V_{ref}$.

In Mode 1, capacitor C1 is assumed initially discharged to ground potential. First, switch S1 is closed to sample the unknown voltage Vx1 onto the top plate of capacitor C1. Next, switch S6 is closed to connect the top plate of capacitor C1 to the comparator. Switch S5 is then closed after a delay to allow the comparator output EOC to settle. It will be clear to those skilled in the art that the length of the delay will be dependant upon the characteristics of the comparator. Simultaneously, a timer starts. The closure of switch S5 connects the current source IL to the capacitor C1 and, hence, the voltage at node A decreases linearly with time. When the voltage at node A decreases to the $V_{ref}$ voltage, the comparator output EOC changes state. This change of state signals the control logic to halt the timer. The time between closure of switch S5 and the change of state of comparator output EOC is denoted Tx1 and represents the difference in voltage between the unknown voltage Vx1 and the reference voltage $V_{ref}$.

(Any number of logic/timer circuit designs for implementing the Modes 1-3 switching waveforms shown in FIG. 2 will be obvious to those skilled in the art.)

Section W2 in the FIG. 2 waveform illustrates the calibration of the measurement circuit with respect to $V_{ref}$. In this mode, switch S2 is closed to sample the reference voltage $V_{ref}$ onto capacitor C1. At the end of the sample period, switch S4 is opened to allow the bottom plate of capacitor C1 to float with respect to ground. Next, switches S3 and S6 are closed, bootstrapping the top plate of capacitor C1 to a voltage of twice the reference voltage $V_{ref}$ and connecting that voltage to the comparator. After a delay to allow the comparator output EOC to settle, switch S5 is closed to discharge capacitor C1 to the reference voltage $V_{ref}$. As in Mode 1, the timer measures the time taken for capacitor C1 to discharge to the reference voltage $V_{ref}$. This time denoted $T_{ref}$ and represents the absolute value of the reference voltage $V_{ref}$.

Section W3 of the FIG. 2 waveform illustrates Mode 3 circuit operation when the unknown voltage Vx2 is less than or equal to the reference voltage $V_{ref}$. Voltage Vx2 is initially sampled onto capacitor C1 as in Mode 1 by closing switch S1. At the end of the sample period, switch S4 is opened to float the bottom plate of the capacitor C1. As in Mode 2 above, switches S3 and S6 are next closed to bootstrap the top plate of capacitor C1 to the reference voltage $V_{ref}$ plus Vx2 and the top plate is connected to the comparator. As in Modes 1 and 2, a delay is introduced to allow the comparator to settle before switch S5 is closed to discharge capacitor C1. The discharge time to the $V_{ref}$ level is measured and denoted Tx2 and represents the difference between the unknown voltage and ground.

During the time that switch S6 is open, the noninverting comparator will be floating and the comparator output EOC must be considered as a "don't care" by the time measurement logic.

Normally, the measurement circuit will have no prior knowledge of whether the unknown voltage Vx is greater than or less than the reference voltage $V_{ref}$. Hence, it is necessary to first assume that the unknown voltage Vx has a value greater than $V_{ref}$ and attempt a measurement. A value of Tx=0 signifies that the unknown voltage Vx is less than or equal to $V_{ref}$ and, hence, another conversion must be initiated with the control signals configured as in Mode 3 above.

The unknown voltage Vx is calculated as follows:

$$Vx1 = (Tx_1/Tref) * V_{ref} + V_{ref}$$

When this result is $Vx1 = V_{ref}$, i.e., Tx1=0, a second measurement is required as in Mode 3 above. In this case the result is $$Vx2 = (Tx2/T_{ref}) * V_{ref}$$

As stated above, the present invention relates generally to battery powered implantible medical devices and, hence, power dissipation and device size are very important criteria. An integrated circuit implementation is an obvious choice given the size restriction. Power dissipation considerations suggest CMOS as the choice of technology.

Figure 3:
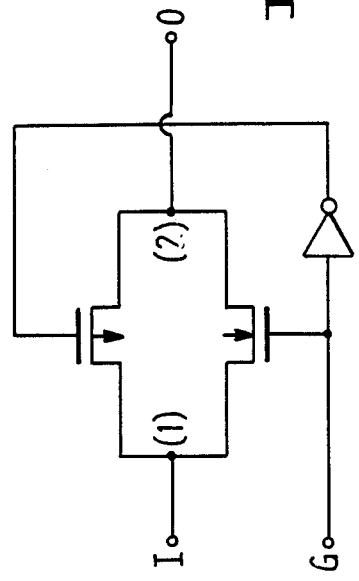
FIG. 3 is a schematic diagram illustrating a CMOS transmission gate utilized in the FIG. 1 circuit.

Capacitor C1 is chosen to be a discrete component since its value needs to be several orders of magnitude greater than the parasitic capacitance associated with switches S1 and S2. The absolute value of capacitor C1 is not critical. Switches S1, S2, S5 and S6 are implemented as a CMOS transmission gate as detailed in FIG. 3. Referring to FIG. 3, nodes 1 and 2 are interchangeably input and output and node G is the control line. Switches S3 and S4 need only be n-channel MOSFET devices since they are only required to conduct towards ground.

IL is a highly linear current source. Those familiar with such circuits will be aware that a cascode arrangement of transistors is required to provide the required linearity. The absolute value of the current is not critical. The value is decided on the basis of a speed versus dissipation trade off.

The comparator as implemented in the illustrated embodiment includes an offset voltage compensation circuit. The period of time when switch S6 is off is used to achieve this compensation. Many well-known circuit techniques will occur to those skilled in the art with regard to achieving this end. The requirement is that the residual comparator offset voltage be substantially less than the allowable error of the measurement system.

The minimum bias current in the comparator is determined by the dV/dt which occurs in capacitor C1 during the measurement process, and the minimum overdrive to which it must respond. The latter condition is a function of the required measurement accuracy. The dV/dt is a function of the ratio IL/C1. Hence, given a fixed C1, the comparator bias current should track IL to maintain the required measurement accuracy.

Overall power dissipation in the type of circuit described above is determined primarily by comparator and current source bias currents. With a good quality CMOS manufacturing process, these currents can be reduced into the 100 nA range without any significant errors being introduced by leakage currents.

Utilizing a measurement circuit in accordance with the present invention, it is possible to achieve an overall voltage measurement accuracy of approximately 0.05% of a full scale voltage in the region of 7V. A 100 nA value for current source IL and a 10 nf value for capacitor C1 results in a maximum conversion time of the order of one-half second.

It should be understood that the scope of the invention is not intended to be limited by the specifics of the above-described embodiment, but rather defined by the accompanying claims.

What is claimed is:

1. A method of measuring an unknown voltage which is greater than a known reference voltage, the method comprising:
   (a) sampling the unknown voltage to a first plate of a capacitor, the second plate of the capacitor being connected to ground;
   (b) connecting the first plate of the capacitor to a first input of a comparator such that the unknown voltage is provided at the first input of the comparator, the second input of the comparator being connected to receive the reference voltage;
   (c) connecting the first plate of the capacitor to a constant current source such that the voltage at the first comparator input decreased linearly with time; and
   (d) measuring the elapsed time between the connection of the first capacitor plate to the constant current source and a change of state of the comparator due to the linear decrease of the voltage at the first comparator input, the elapsed time corresponding to the difference in voltage between the unknown voltage and the reference voltage.

2. A method as in claim 1 wherein the connecting of the first plate of the capacitor to the constant current source is delayed for a preselected time after connecting the first plate of the capacitor to the first input of the comparator.

3. A method of measuring an unknown voltage which is less than or equal to a known reference voltage, the method comprising:
   (a) sampling the unknown voltage to a first plate of a capacitor, the second plate of the capacitor being connected to ground;
   (b) disconnecting the second plate of the capacitor from ground;
   (c) connecting the first plate of the capacitor to a first input of a comparator and the second plate of the capacitor to the reference voltage such that the voltage at the first plate of the capacitor is bootstrapped to the reference voltage plus the unknown voltage and is provided at the first input of the comparator, the second input of the comparator being connected to receive the reference voltage;
   (d) connecting the first plate of the capacitor to a constant current source such that the voltage at the first comparator input decreases linearly with time; and
   (e) measuring the elapsed time between the connection of the first capacitor plate to the constant current source and a change of state of the comparator due to the linear decrease of the voltage at the first comparator input, the elapsed time corresponding to the difference between the unknown voltage and ground.

4. A method as in claim 3 wherein the connecting of the first plate of the capacitor to the constant current source is delayed for a preselected time after connecting the first plate of the capacitor to the first input of the comparator 5. A method of calibrating a voltage measurement circuit with respect to a known reference voltage, the method comprising
   (a) sampling the reference voltage to a first plate of a capacitor, the second plate of the capacitor being connected to ground;
   (b) disconnecting the second plate of the capacitor from ground;
   (c) connecting the second plate of the capacitor to receive the reference voltage;
   (d) connecting the first plate of the capacitor to a first input of a comparator, the second input of the comparator being connected to receive the reference voltage;
   (e) connecting the first plate of the capacitor to a constant current source such that the voltage at the first comparator input decreases linearly with time; and
   (f) measuring the elapsed time between the connection of the first capacitor plate to the constant current source and a change of state of the comparator due to the decrease of the voltage at the first comparator input, the elapsed time corresponding to the absolute value of the reference voltage.

6. A voltage measurement circuit for measuring an unknown voltage which is greater than a known reference voltage, the voltage measurement circuit comprising
   (a) a capacitor having a first plate and a second plate, the second plate being connected to ground;
   (b) means for sampling the unknown voltage to the first plate of the capacitor;
   (c) a comparator having a first input and a second input, the second input being connected to receive the reference voltage;
   (d) means for connecting the first plate of the capacitor to the first input of the comparator such that the unknown voltage is provided at the first input of the comparator;
   (e) a constant current source;
   (f) means for connecting the first plate of the capacitor to the constant current source such that the voltage at the first input of the comparator decreases linearly with time; and
   (g) a timer, connected to receive the comparator output, for measuring the elapsed time between the connection of the first capacitor plate to the constant current course and a change of state of the comparator output due to the linear decrease of the voltage at the first comparator input, the elapsed time corresponding to the difference in voltage between the unknown voltage and the reference voltage.

7. A voltage measurement circuit for measuring an unknown voltage which is less than or equal to a known reference voltage, the voltage measurement circuit comprising:
   (a) a capacitor having a first plate and a second plate, the second plate being connected to ground;
   (b) means for sampling the unknown voltage to the first plate of the capacitor;
   (c) a comparator having a first input and a second input, the second input being connected to receive the reference voltage;
   (d) means for disconnecting the second plate of the capacitor from ground;
   (e) means for connecting the first plate of the capacitor to a first input of the comparator and the second plate of the capacitor to the reference voltage such that the voltage at the first plate of the capacitor is bootstrapped to the reference voltage plus the unknown voltage and is provided at the first input of the comparator;
   (f) a constant current source;
   (g) means for connecting the first plate of the capacitor to the constant current source such that the voltage at the first input of the comparator decreases linearly with time; and
   (h) a timer, connected to receive the comparator output, for measuring the elapsed time between the connection of the first capacitor plate to the constant current source and a change of state of the comparator output due to the linear decrease of the voltage at the first input of the comparator, the elapsed time corresponding to the difference between the unknown voltage and ground.

8. A circuit for calibrating a voltage measurement circuit with respect to a known reference voltage, the calibration circuit comprising:
   (a) a capacitor having a first plate and second plate, the second plate being connected to ground;
   (b) means for sampling the reference voltage to the first plate of the capacitor;
   (c) means for disconnecting the second plate of the capacitor from ground and for connecting the second plate of the capacitor to receive the reference voltage;
   (d) a comparator having a first input and a second input, the second input being connected to receive the reference voltage;

(e) means for connecting the first plate of the capacitor to the first input of the comparator;
(f) a constant current source;
(g) means for connecting the first plate of the capacitor to the constant current source such that the voltage of the first comparator input decreases linearly with time; and
(h) a timer, connected to receive the comparator output, for measuring the elapsed time between the connection of the first comparator plate to the constant current source and a change of state of the comparator output due to the decrease of the voltage at the first comparator input, the elapsed time corresponding to the absolute value of the reference voltage.

9. A method of measuring an unknown voltage which is greater than a known reference voltage, the method comprising:
(a) sampling the reference voltage to a first plate of a capacitor, the second plate of the capacitor being connected to ground;
(b) disconnecting the second plate of the capacitor from ground;
(c) connecting the second plate of the capacitor to receive the reference voltage such that the voltage at the first plate of the capacitor is bootstrapped to twice the reference voltage;
(d) connecting the first plate of the capacitor to a first input of a comparator, the second input of the comparator being connected to receive the reference voltage;
(e) connecting the first plate of the capacitor to a constant current source such that the voltage at the first comparator input decreases linearly with time;
(f) measuring the elapsed time between the connection of the first capacitor plate to the constant current source and a change of state of the comparator due to the linear decrease of the voltage at the first comparator input, the elapsed time corresponding to the absolute value of the reference voltage;
(g) sampling the unknown voltage to the first plate of the capacitor and connecting the second plate of the capacitor to ground;
(h) connecting the first plate of the capacitor to the first input of the comparator such that the unknown voltage is provided at the first input of the comparator;
(i) connecting the first plate of the capacitor to the constant current source such that the unknown voltage at the first comparator input decreases linearly with time; and
(j) measuring the elapsed time between the connection of the first capacitor plate to the constant current source and a change of state of the comparator due to the decrease of the unknown voltage at the first comparator input, the elapsed time corresponding to the difference in voltage between the unknown voltage and the reference voltage.

10. A method of measuring an unknown voltage which is less than or equal to a known reference voltage, the method comprising:
(a) sampling the reference voltage to a first plate of a capacitor, the second plate of the capacitor being connected to ground;
(b) disconnecting the second plate of the capacitor from ground;
(c) connecting the second plate of the capacitor to receive the reference voltage such that the voltage at the first plate of the capacitor is bootstrapped to twice the reference voltage;
(d) connecting the first plate of the capacitor to the first input of a comparator, the second input of the comparator being connected to receive the reference voltage;
(e) connecting the first plate of the capacitor to a constant current source such that the voltage at the first comparator input decreases linearly with time;
(f) measuring the elapsed time between the connection of the first capacitor plate to the constant current source and a change of state of the comparator due to the linear decrease of the voltage at the first comparator input, the elapsed time corresponding to the absolute value of the reference voltage;
(g) sampling the unknown voltage to the first plate of the capacitor and connecting the second plate of the capacitor to ground;
(h) disconnecting the second plate of the capacitor from ground;
(i) connecting the first plate of the capacitor to the first input of the comparator and the second plate of the capacitor to the reference voltage such that the voltage at the first plate of the capacitor is bootstrapped to the reference voltage plus the unknown voltage and is provided at the first input of the comparator;
(j) connecting the first plate of the capacitor to a constant current source such that the voltage at the first comparator input decreases linearly with time; and
(k) measuring the elapsed time between the connection of the first capacitor plate to the constant current source and a change of state of the comparator due to the linear decrease of the voltage at the first comparator input, the elapsed time corresponding to the difference between the unknown voltage and ground.

11. A voltage measurement circuit for measuring an unknown voltage which is greater than a known reference voltage, the voltage measurement circuit comprising
(a) calibrating means for calibrating the voltage measurement circuit with respect to the reference voltage, the calibrating means comprising:
(i) a capacitor having a first plate and second plate, the second plate being connected to ground;
(ii) means for sampling the reference voltage to the first plate of the capacitor;
(iii) means for disconnecting the second plate of the capacitor from ground;
(iv) means for connecting the second plate of the capacitor to receive the reference voltage such that the voltage at the first plate of the capacitor is bootstrapped to twice the reference voltage;
(v) a comparator having a first input and a second input, the second input being connected to receive the reference voltage;
(vi) means for connecting the first plate of the capacitor to the first input of the comparator;
(vii) a constant current source;
(viii) means for connecting the first plate of the capacitor to the constant current source such that the voltage at the first input of the comparator decreases linearly with time; and
(ix) timer means, connected to receive the comparator output, for measuring the elapsed time between the connection of the first plate of the capacitor to the constant current source and a change of state of the comparator output due to the linear decrease of the voltage at the first input of the comparator, the elapsed time corresponding to the absolute value of the reference voltage;
(b) means for sampling the unknown voltage to the first plate of the capacitor and connecting the second plate of the capacitor to ground;
(c) means for connecting the first plate of the capacitor to the first input of the comparator such that the unknown voltage is provided at the first input of the comparator;
(d) means for connecting the first plate of the capacitor to the constant current source such that the voltage at the first comparator input decreases linearly with time; and
(e) timer means connected to receive the comparator output, for measuring the elapsed time between the connection of the first plate of the capacitor to the constant current source and a change of state of the comparator output due to the linear decrease of the voltage at the first input of the comparator, the elapsed time corresponding to the difference in voltage between the unknown voltage and the reference voltage.

12. A voltage measurement circuit for measuring an unknown voltage which is less than or equal to a known reference voltage, the voltage measurement circuit comprising:
(a) calibrating means for calibrating the voltage measurement circuit with respect to the reference voltage, the calibrating means comprising:
  (i) a capacitor having a first plate and a second plate, the second plate being connected to ground;
  (ii) means for sampling the reference voltage to the first plate of the capacitor;
  (iii) means for disconnecting the second plate of the capacitor from ground;
  (iv) means for connecting the second plate of the capacitor to receive the reference voltage such that the voltage at the first plate of the capacitor is bootstrapped to twice the reference voltage;
  (v) a comparator having a first input and a second input, the second input being connected to receive the reference voltage;
  (vi) means for connecting the first plate of the capacitor to the first input of the comparator;
  (vii) a constant current source;
  (viii) means for connecting the first plate of the capacitor to the constant current source such that the voltage at the first input of the comparator decreases linearly with time; and
  (ix) timer means, connected to receive the comparator output, for measuring the elapsed time between the connection of the first plate of the capacitor to the constant current source and a change of state of the comparator output due to the linear decrease of the voltage at the first input of the comparator, the elapsed time corresponding to the absolute value of the reference voltage;
(b) means for sampling the unknown voltage to the first plate of the capacitor and connecting the second plate of the capacitor to ground;
(c) means for connecting the first plate of the capacitor to the first input of the comparator and the second plate of the capacitor to the reference voltage such that the voltage at the first plate of the capacitor is bootstrapped to the reference voltage plus the unknown voltage and is provided at the first input of the comparator;
(d) means for connecting the first plate of the capacitor to the constant current source such that the voltage at the first input of the comparator decreases linearly with time; and
(e) a timer, connected to receive the comparator output, for measuring the elapsed time between the connection of the first capacitor plate to the constant current source and a change of state of the comparator output due to the linear decrease of the voltage at the first input of the comparator, the elapsed time corresponding to the difference between the unknown voltage and ground.

* * * * *